(12) United States Patent
Huang et al.

(10) Patent No.: US 11,227,650 B1
(45) Date of Patent: Jan. 18, 2022

(54) DELAY CIRCUITRY WITH REDUCED INSTABILITIES

(71) Applicant: Micron Technology, Inc., Boise, ID (US)

(72) Inventors: Zhi Qi Huang, Xuhui (CN); Wei Lu Chu, Pudong (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/002,398

(22) Filed: Aug. 25, 2020

(51) Int. Cl.
*G11C 8/18* (2006.01)
*G11C 11/4076* (2006.01)

(52) U.S. Cl.
CPC .................. *G11C 11/4076* (2013.01)

(58) Field of Classification Search
CPC .................................. G11C 11/4076
USPC ........................................ 365/233.1
See application file for complete search history.

(56) References Cited

U.S. PATENT DOCUMENTS

| 2005/0099756 | A1* | 5/2005 | Sato ...................... G11C 11/406 361/194 |
| 2009/0256611 | A1* | 10/2009 | Takahashi .............. H03K 5/131 327/270 |
| 2015/0155029 | A1* | 6/2015 | Kim .................. G11C 11/40615 365/222 |
| 2015/0155032 | A1* | 6/2015 | Tong ........................ G11C 8/18 365/154 |

* cited by examiner

*Primary Examiner* — Min Huang
(74) *Attorney, Agent, or Firm* — Fletcher Yoder, P.C.

(57) ABSTRACT

An electronic device includes a first input that receives an input signal when the electronic device is in operation, a long L gate comprising a long L transistor, a first activation transistor coupled to a gate of the long L transistor, and a second activation transistor coupled to the gate of the long L transistor. The electronic device also includes a switch directly coupled to a second input of the long L gate, a path directly coupled to a first output of the long L gate, a capacitor coupled to the path, and a second output that when in operation transmits an output signal as a delayed signal with respect to the input signal.

20 Claims, 5 Drawing Sheets

DELAY CIRCUITRY WITH REDUCED INSTABILITIES

BACKGROUND

Field of the Present Disclosure

Embodiments of the present disclosure relate generally to the field of semiconductor devices. More specifically, embodiments of the present disclosure relate to delay circuitry having reduced degradation characteristics.

Description of Related Art

Generally, electronic devices, such as semiconductor devices, memory chips, microprocessor chips, image chips, and the like, may include one or more delay circuits, which may be circuits that can impose a delay in the transmission of a digital pulse. Accordingly, delay circuits may be used synchronize or otherwise adjust the timings of signals transmitted to particular components of the electronic device. Delay circuits provide an amount of delay to a signal when implemented in an electronic device. However, the amount of delay should be predictable and repeatable. That is, the desired amount of delay of a signal provided by a delay circuit should correspond to the actual amount of delay provided to the signal when the delay circuit is in operation. Various factors may cause degradation of the delay circuit over time such that the delay circuit will cease to operate within its tolerance levels, thus leading to functionality issues for the electronic device in which the delay circuits are implemented.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Delay circuitry (e.g., delay circuits) are used in electronic devices, such as memory devices, to adjust the timing of digital signals. However, over time, the delay circuits may experience degradation that causes the actual amount of delay provided to an input signal to vary from its expected value. Accordingly, present embodiments provide delay circuits that operate to reduce degradation of the delay circuit over time, leading to longer functionality of the delay circuits and, as a result, the electronic devices in which they are disposed.

Figure 1:
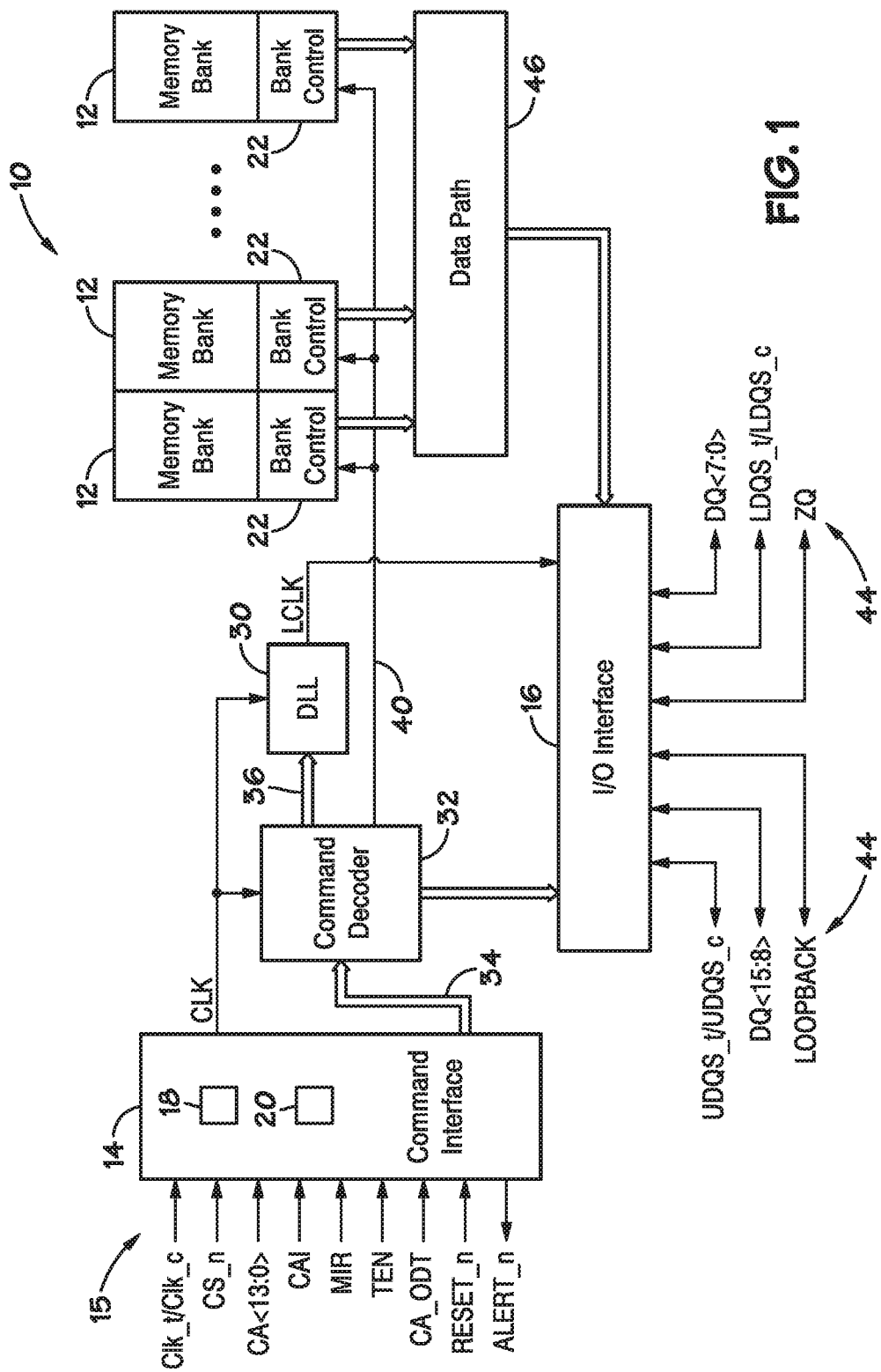
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x4, x8, or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/Vss external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external Vdd and Vss signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
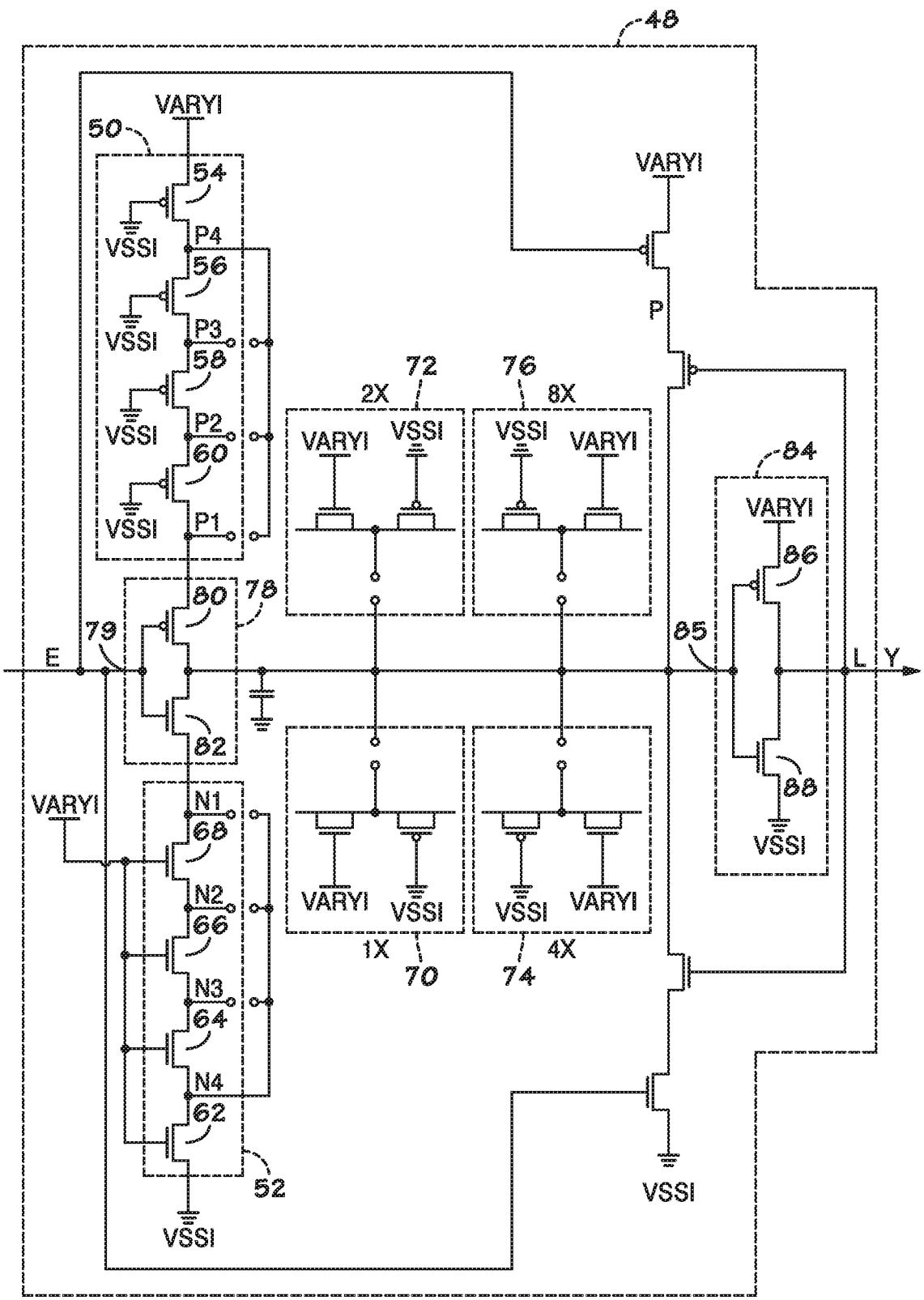
FIG. 2 is a circuit diagram of a first embodiment of a delay circuit of the memory device of FIG. 1, according to an embodiment of the present disclosure.

With the foregoing in mind, FIG. 2 is a schematic diagram of a delay circuit 48. This delay circuit 48 may be utilized, for example, in conjunction with bank control block 22 to selectively delay a signal transmitted into the bank control block 22 and/or from the bank control block 22. In some embodiments, more than one delay circuit 48 is utilized in conjunction with each respective bank control block 22 and each delay circuit(s) 48 may be physically disposed in the respective bank control blocks 22 or coupled thereto. Additionally and/or alternatively, the delay circuit(s) 48 may be utilized, for example, in conjunction with power supply circuits of the memory device 10 and may be physically disposed in the power supply circuits or coupled thereto. Likewise, the delay circuit(s) 48 may be utilized, for example, in conjunction with the ZQ calibration signal and may be physically disposed or coupled to the IO interface 16. It should be appreciated that these are examples of the locations and uses for the delay circuit 48, however, it is recognized that the delay circuit(s) 48 can be additionally used in other locations in the memory device 10 or used in conjunction with the memory device 10 to synchronize or otherwise adjust the timings of signals transmitted to particular components of the memory device 10.

While delay circuits can be fixed (e.g., provide a fixed amount of signal delay), the delay circuit 48 described herein is variable (e.g., an adjustable amount of delay is provided by the delay circuit 48) when operated in conjunction with the memory device 10. The delay circuit 48, as described herein, is a gate capacitor (GC) delay circuit, where the gate is represented by long L gate 50 and long L gate 52. Long L gate 50 includes a number, e.g., four, of long L transistors 54, 56, 58, and 60 whereby the length of transistors 54, 56, 58, and 60 is much larger than the width of the long L transistors 54, 56, 58, and 60. An example of a length to width ratio for the long L transistors 54, 56, 58, and 60 may be approximately 35/2 or another ratio. Likewise, long L gate 52 includes a number, e.g., four, of long L transistors 62, 64, 66, and 68 with the same or similar length to width ratio of long L transistors 54, 56, 58, and 60. The eight long L transistors 54, 56, 58, 60, 62, 64, 66, and 68 mimic resistors of a traditional resistor capacitor (RC) delay circuit. For example, the long L transistors 54, 56, 58, and 60 of the long L gate 50 and the long L transistors 62, 64, 66, and 68 of the long L gate 52 each operate as resistors in series to combine to a resultant resistance that affects the delay of the delay circuit 48.

The delay circuit 48 also includes a plurality of capacitors 70, 72, 74, and 76. As illustrated, capacitor 72 has twice the capacitance of capacitor 70, capacitor 72 has four times the capacitance of capacitor 70, and capacitor 76 has eight times the capacitance of capacitor 70. Each of the capacitors 70, 72, 74, and 76 may be activated (controlled) via a switch so that it may be used in the delay circuit 48. Through the use of capacitors 70, 72, 74, and 76 having variable capacitances, the delay circuit 48 is able to selectively adjust its capacitance by activating one or more of the capacitors 70, 72, 74, and 76. This, in turn, allows for increased variability in the delay provided by the delay circuit 48, the delay provided by delay circuit 48 is directly related to the capacitance (e.g., the size and/or amount of capacitance provided in the delay circuit 48). That is, the delay of the delay circuit 48 is governed, for example, by the long L gate 50 providing resistance (when the incoming signal is on a falling edge) or by the long L gate 52 providing resistance (when the incoming signal is on a rising edge) and by the size of the capacitance, governed by the selected capacitors 70, 72, 74, and 76 (e.g., the larger the selected capacitance, the longer it will take to charge the respective capacitors 70, 72, 74, and 76, resulting in a longer delay provided by the delay circuit 48).

Delay circuit 48 additionally includes a switching circuit 78 that controls which of the long L gate 50 and the long L gate 52 is active. The switching circuit 78 includes an input 79 that receives the input signal "E" to be delayed. The switching circuit 78, as illustrated, includes a p-type metal oxide semiconductor (PMOS) transistor 80 that is activated by lowering the voltage at its gate, i.e., as E is on a falling edge or is a binary 0. The switching circuit 78, as illustrated, also includes an n-type metal oxide semiconductor (NMOS) transistor 82 that is activated by raising the voltage at its gate, i.e., as E is on a rising edge or is a binary 1. Additionally, the delay circuit 48 includes a trip-point circuit 84 that controls output of the delayed output signal "L" that is received at an input 85 of the trip-point circuit 84 using a PMOS transistor 86 and an NMOS transistor 88 that function similarly to the PMOS transistor 80 and NMOS transistor 82 described above.

As the delay circuit 48 operates over time, the eight long L transistors 54, 56, 58, 60, 62, 64, 66, and 68, the PMOS transistors 80 and 86, and the NMOS transistors 82 and 88 can experience degradation, for example, aging deterioration called BTI (Bias Temperature Instability) deterioration. BTI deterioration can cause a threshold voltage of a transistor to rise as the transistor is ON, resulting in a decrease in drain current. The shift in the threshold voltage of the long L transistors 54, 56, 58, 60, 62, 64, 66, and 68, the PMOS transistors 80 and 86, and the NMOS transistors 82 and 88 may be approximately 10%, between 9% and 14%, or another value, depending on the type of transistor and the amount of time it is ON. This BTI deterioration causing the shift in the threshold voltage can alter the resulting resistance of the eight long L transistors 54, 56, 58, 60, 62, 64, 66, and 68, causing undesirable alteration in the delay time of the delay circuit 48 from its expected amount of delay of E to an actual (increased) amount of delay provided to E.

Figure 3:
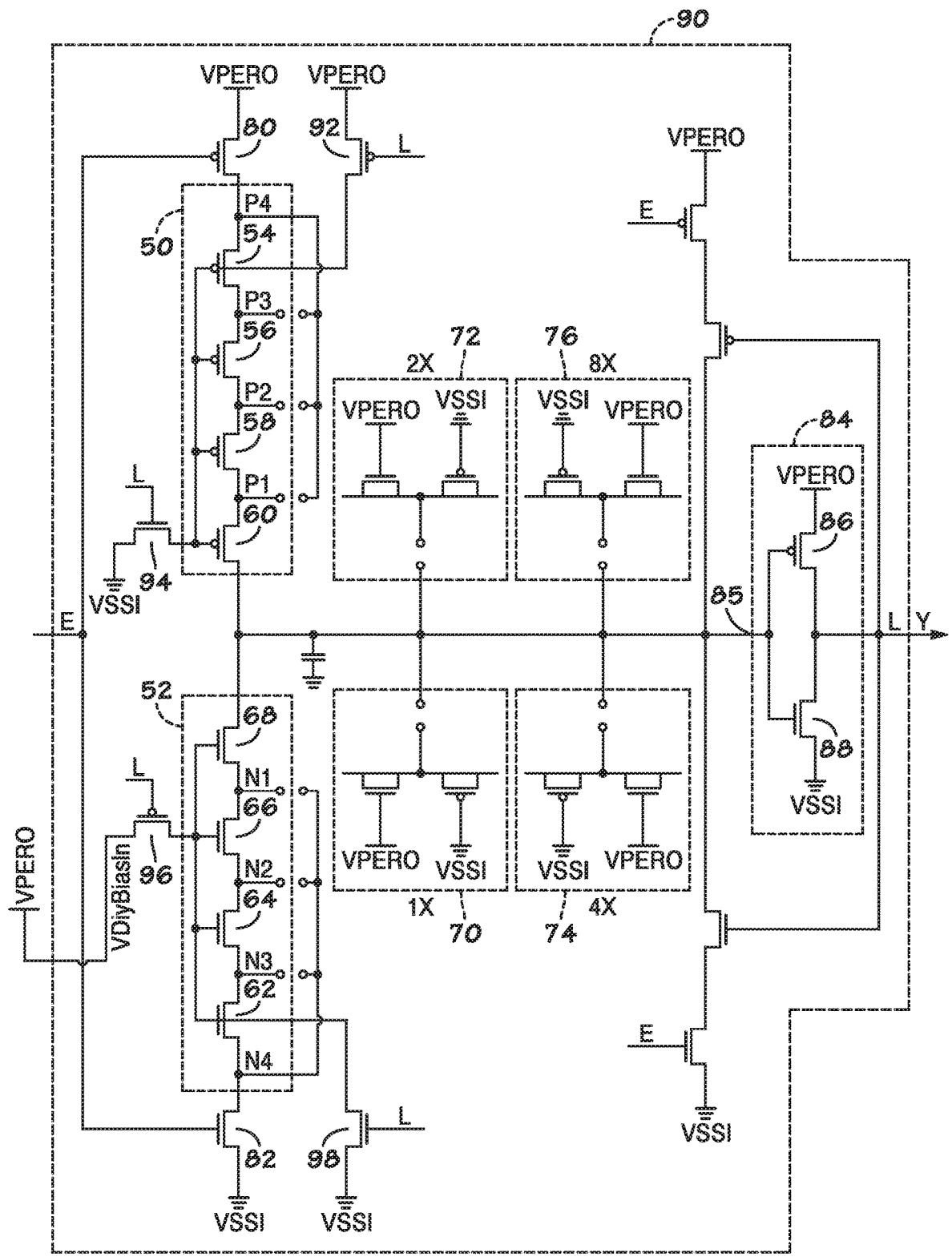
FIG. 3 is a circuit diagram of a second embodiment of a delay circuit of the memory device of FIG. 1, according to an embodiment of the present disclosure.

With the foregoing in mind, FIG. 3 is a schematic diagram of a second embodiment of a delay circuit 90 that can be utilized in place of the delay circuit 48 to reduce the BTI degradation of at least the eight long L transistors 54, 56, 58,

60, 62, 64, 66, and 68. As illustrated, the switching circuit 78 that controls which of the long L gate 50 and the long L gate 52 is active in delay circuit 90 is eliminated and instead, the delay circuit 90 includes the PMOS transistor 80 as being coupled to the input (e.g., initial or starting portion) of the long L gate 50. This is in contrast to the switching circuit 78 of the delay circuit in which the PMOS transistor 80 is coupled to the output (e.g., final or ending portion) of the long L gate 50. That is, the PMOS transistor 80 in delay circuit 90 as an activation circuit for the long L gate 50 is in series with and operates as an input to (i.e., upstream of) the long L gate 50. Similarly, the delay circuit 90 includes the NMOS transistor 82 is coupled to the input (e.g., initial or starting portion) of the long L gate 52. This is in contrast to the switching circuit 78 of the delay circuit in which the NMOS transistor 82 is coupled to the output (e.g., final or ending portion) of the long L gate 52. That is, the NMOS transistor 82 in delay circuit 90 as an activation circuit for the long L gate 52 is in series with and operates as an input to (i.e., upstream of) the long L gate 52. Additionally, in some embodiments, PMOS transistor 92, NMOS transistor 94, PMOS transistor 96, and NMOS transistor 98 can also be added to the delay circuit. The PMOS transistor 92, NMOS transistor 94, PMOS transistor 96, and NMOS transistor 98 are in an inverter configuration and can operate to, for example, reduce the gate to source voltage (Vgs) of the long L transistors 54, 56, 58, 60, 62, 64, 66, and 68 during stable state operation.

For example, when the input signal E is toggling from low (e.g., 0) to high (e.g., 1) with the output signal L still low, the PMOS transistor 80 is turned OFF. However, as the output signal L is still low, the PMOS transistor 92 is ON and the NMOS transistor 94 is OFF (since the gate of each of the PMOS transistor 92 and the NMOS transistor 94 is coupled to the output transmitting the output signal L). This results in the gates of the long L transistors 54, 56, 58, and 60 being isolated from Vss, which is only coupled to the gates of the long L transistors 54, 56, 58, and 60 when the NMOS transistor 94 is ON). Additionally at this time, the discharge path (the path coupled to the one or more capacitors 70, 72, 74, and 76) is turned on. After discharging of the one or more capacitors 70, 72, 74, and 76 is finished, the output signal L toggles from low to high (in conjunction with the input signal E having previously toggled from low to high) and the PMOS transistor 92 is turned OFF while the NMOS transistor 94 is turned ON, since the output signal L is applied to their respective gates. This causes the gate of long L gate 50 to be tied to Vss via the NMOS transistor 94.

As this is occurring, a similar operation in reverse (as the output signal L moves from low to high), the long L gate 52 is isolated from VSS. As the output signal L is low, the NMOS transistor 98 is ON and the PMOS transistor 96 is OFF (since the gate of each of the PMOS transistor 96 and the NMOS transistor 98 is coupled to the output transmitting the output signal L). This results in the gates of the long L transistors 62, 64, 66, and 68 being coupled to Vss. However, as the as the output signal L moves from low to high, the gates of the long L transistors 62, 64, 66, and 68 are isolated from Vss, since the NMOS transistor 98 is switched to OFF and the PMOS transistor 96 is switched to ON (i.e., Vss is only coupled to the gates of the long L transistors 62, 64, 66, and 68 when the NMOS transistor 94 is ON). This similarly reduces and/or eliminates Vgs stress of the long L transistors 62, 64, 66, and 68. In this manner, the gate connection of the long L gate 50 and the long L gate 52 is adjusted relative to the delay circuit 48, allowing for a reduction and/or elimination of Vgs stress during stable state.

Switching of the gate connection of the long L gate 50 and the long L gate 52 from always being powered (as illustrated in delay circuit 48) to being powered half as often reduces the amount of time that the gates of the long L transistors 54, 56, 58, 60, 62, 64, 66, and 68 are ON. This results in a corresponding reduction in BTI deterioration of the long L transistors 54, 56, 58, 60, 62, 64, 66, and 68 and, accordingly, reduces the deterioration of the delay circuit 90. Additionally, by moving the long L gate 50 and long L gate 52 activation switches (the PMOS transistor 80 and the NMOS transistor 82) to a input in-series configuration, as illustrated in FIG. 3, it has been found that surface area in the delay circuit 90 is freed up so that inclusion of the PMOS transistor 92, NMOS transistor 94, PMOS transistor 96, and NMOS transistor 98 results in a negligible layout size (footprint) difference of the delay circuit 90 relative to the delay circuit 48 and the delay circuit 90 can indeed have a smaller footprint relative to the delay circuit 48. Further gains in the footprint of the delay circuit 90 may be accomplished, for example, by the removal of one of the capacitors, for example, capacitor 72.

Through the use of the PMOS transistor 92, NMOS transistor 94, PMOS transistor 96, and NMOS transistor 98 in the manner described above, the BTI deterioration of the long L gate 50 (PBTI deterioration) and the BTI deterioration of the long L gate 52 (NBTI deterioration) may be reduced, providing advantages in both the lifespan of the delay circuit 90 as well as its functioning in providing delays that correspond to expected delays of the delay circuit 90. Additionally, power is no longer directly supplied to the long L gate 50 and long L gate 52 (as illustrated in the delay circuit 48 of FIG. 2). Instead, the power is indirectly supplied to the long L gate 50 and long L gate 52 in the delay circuit 90 through the long L gate 50 and long L gate 52 activation switches (the PMOS transistor 80 and the NMOS transistor 82). Thus, by positioning the long L gate 50 and long L gate 52 activation switches (the PMOS transistor 80 and the NMOS transistor 82) as inputs to the long L gate 50 and long L gate 52, respectively, the long L gate 50 and long L gate 52 activation switches (the PMOS transistor 80 and the NMOS transistor 82) can operate to sever one or more of the long L transistor 54 and the long L transistor 62, respectively, from power during the times in which the long L gate 50 and long L gate 52 are inactive, further improving reliability of the delay circuit 90.

Figure 4:
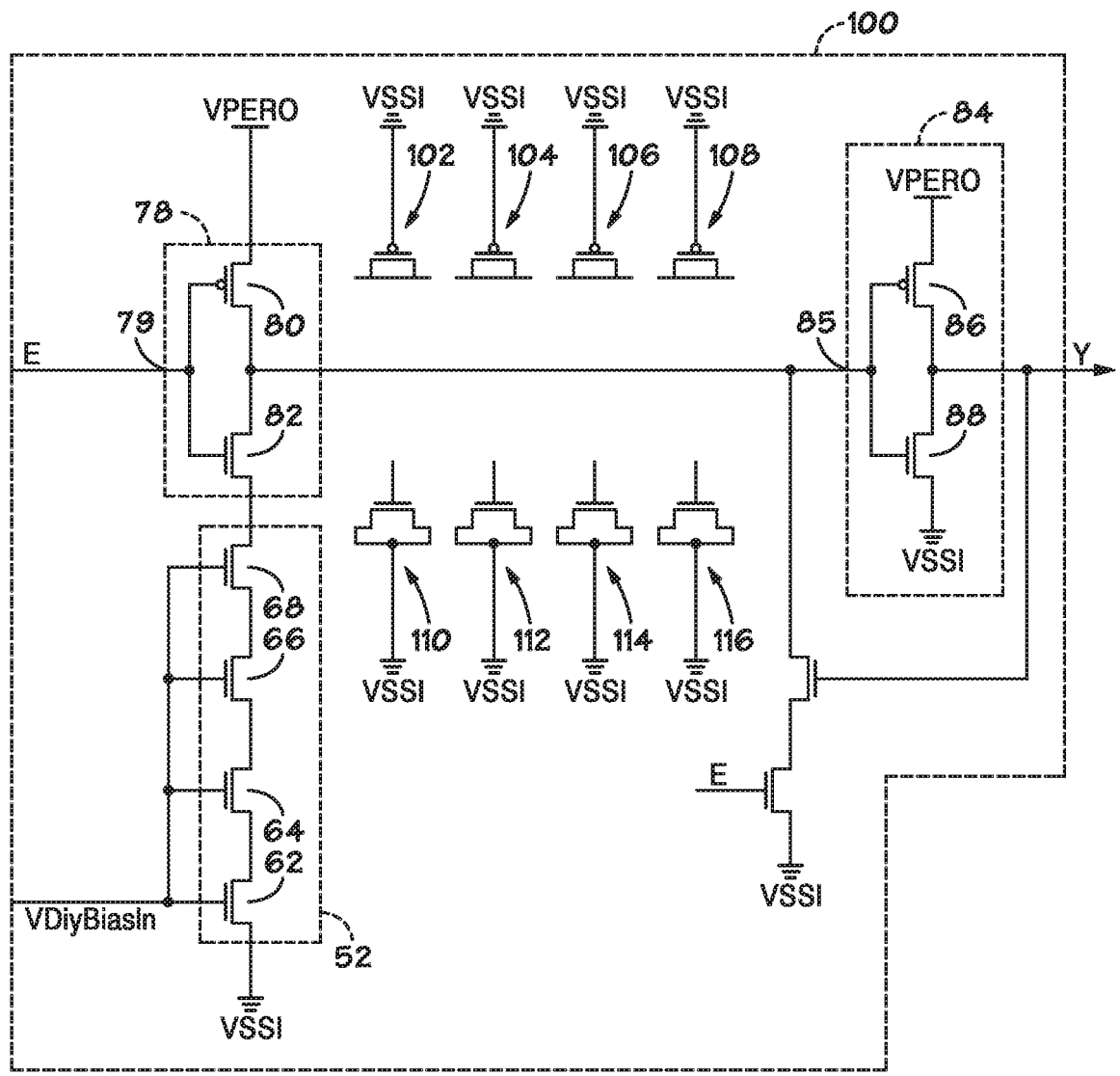
FIG. 4 is a circuit diagram of a third embodiment of a delay circuit of the memory device of FIG. 1, according to an embodiment of the present disclosure.

FIG. 4 illustrates another embodiment of a delay circuit 100. The delay circuit 100 represents a single edge delay circuit. As illustrated, there is no long L gate 50 so only rising edge delay is provided by the delay circuit 100. The delay circuit 100 includes elements similar to the delay circuit 48, with the exception of capacitors 102, 104, 106, 108 (P-node capacitors) and capacitors 110, 112, 114, 116 (N-node capacitors) being utilized in the delay circuit 100 and the delay circuit 100 operates in a manner similar to the delay circuit 48 described above. Accordingly, the delay circuit 100 may experience similar NBTI deterioration as that described above with respect to delay circuit 48.

Figure 5:
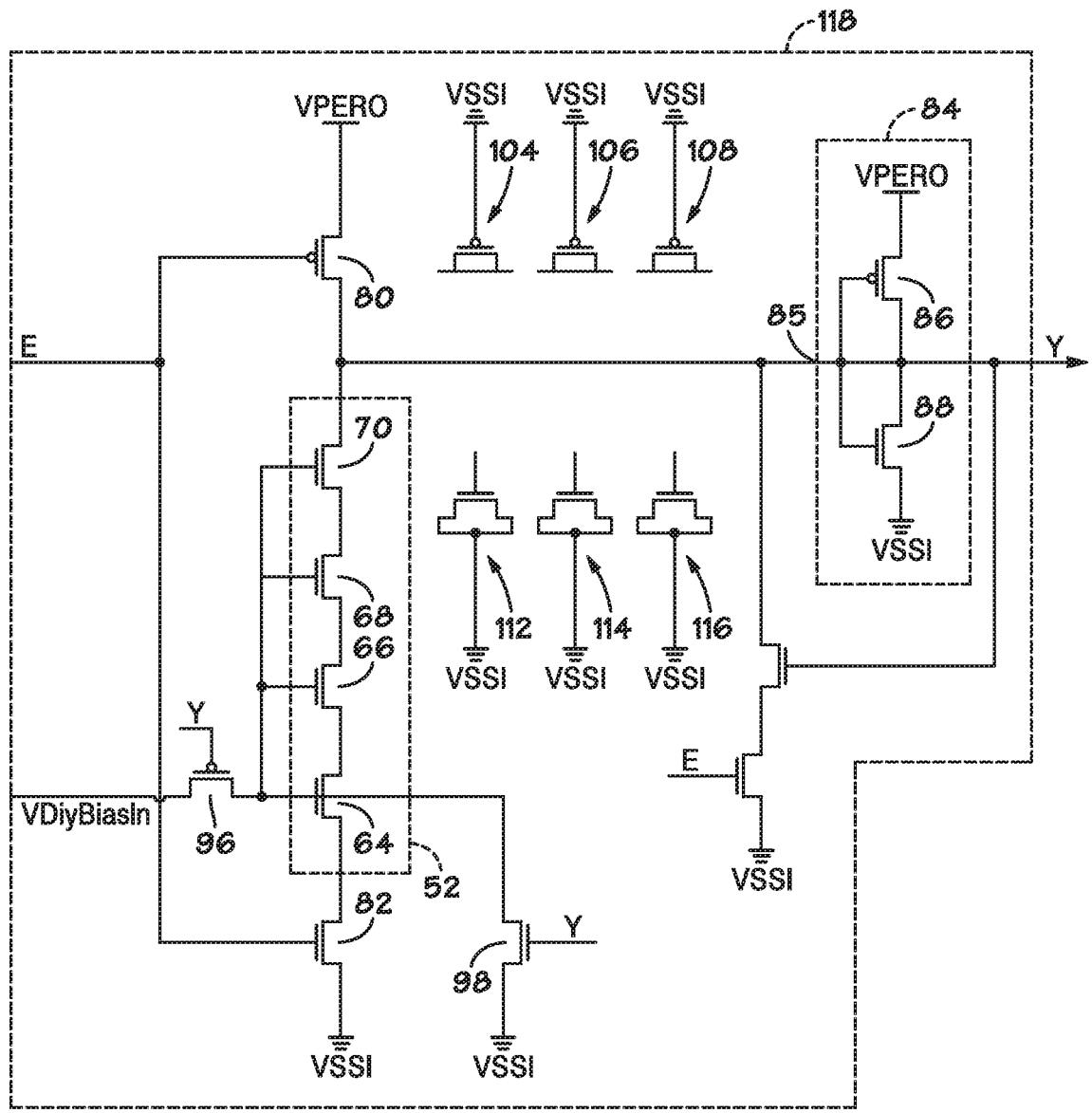
FIG. 5 is a circuit diagram of a fourth embodiment of a delay circuit of the memory device of FIG. 1, according to an embodiment of the present disclosure.

FIG. 5 illustrates a second embodiment of a single edge delay circuit, illustrated as delay circuit 118. As illustrated, the delay circuit 118 includes elements similar to the delay circuit 90, with the exception of capacitors 104, 106, 108 (P-node capacitors) and capacitors 112, 114, 116 (N-node capacitors) being utilized in the delay circuit 100. Furthermore, the delay circuit 118 operates in a manner similar to the delay circuit 90 described above. Additionally, as illustrated in FIG. 5, capacitors 102 and 110 may be removed from the delay circuit 118 relative to the delay circuit 100 to reduce the footprint of the delay circuit 118 to allow for, for example, the additional PMOS transistor 96 and the additional NMOS transistor 98 to be utilized in the delay circuit 118. Because the delay circuit 118 operates in a manner similar to the delay circuit 90 described above, the delay circuit 118 likewise experiences improved NBTI deterioration relative to the delay circuit 100, similar to that described above with respect to delay circuit 90. Furthermore, it should be noted that the delay circuit 118 (a driving edge delay circuit), can be implemented instead as a falling edge delay circuit whereby the long L gate 50 and corresponding PMOS transistor 92 and NMOS transistor 94 are utilized and the long L gate 52 and corresponding PMOS transistor 96 and NMOS transistor 98 are omitted.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
   a first input that receives an input signal when the electronic device is in operation;
   a long L gate comprising a long L transistor;
   a first activation transistor coupled to a gate of the long L transistor;
   a second activation transistor coupled to the gate of the long L transistor;
   a switch directly coupled to a second input of the long L gate;
   a path directly coupled to a first output of the long L gate;
   a capacitor coupled to the path; and
   a second output that when in operation transmits an output signal as a delayed signal with respect to the input signal.

2. The electronic device of claim 1, wherein the capacitor is coupled to a second switch that when in operation selectively activates the capacitor to store charge transmitted from the long L transistor and subsequently discharge stored energy of the capacitor.

3. The electronic device of claim 2, wherein a value of the output signal is based upon whether the capacitor is storing the charge transmitted from the long L transistor or is subsequently discharging the stored energy of the capacitor.

4. The electronic device of claim 2, comprising a second capacitor coupled to the path and to a third switch that when in operation selectively activates the second capacitor to store the charge transmitted from the long L transistor in conjunction with the first capacitor and subsequently discharge stored energy of the second capacitor.

5. The electronic device of claim 4, wherein a value of the output signal generated is based upon whether the capacitor and the second capacitor are storing the charge transmitted from the long L transistor or subsequently discharging the stored energy of the capacitor and the stored energy of the second capacitor.

6. The electronic device of claim 1, comprising a second path coupled between the first input of the electronic device and a gate of the switch.

7. The electronic device of claim 6, wherein the switch when in operation is activated when the input signal comprises a first value and deactivated when the input signal comprises a second value.

8. The electronic device of claim 1, comprising a second path coupled between the second output of the electronic device and a gate of the first activation transistor.

9. The electronic device of claim 8, wherein the second path is coupled between the second output of the electronic device and a gate of the second activation transistor.

10. The electronic device of claim 9, wherein the output signal activates the first activation transistor and deactivates the second activation transistor when the output signal has a first value.

11. The electronic device of claim 10, comprising:
    a second long L gate comprising a second long L transistor and a third output directly coupled to the path;
    a third activation transistor coupled to a gate of the second long L transistor; and
    a fourth activation transistor coupled to the gate of the second long L transistor.

12. The electronic device of claim 11, comprising:
    a second switch directly coupled to a third input of the second long L gate; and
    a third path coupled between the first input of the electronic device and a gate of the second switch, wherein the second switch when in operation is activated when the input signal comprises a first value and deactivated when the input signal comprises a second value.

13. The electronic device of claim 11, wherein the second path is coupled between the second output of the electronic device and a gate of the third activation transistor, wherein the second path is coupled between the second output of the electronic device and a gate of the fourth activation transistor.

14. The electronic device of claim 13, wherein the output signal activates the third activation transistor and deactivates the fourth activation transistor when the output signal has the first value.

15. A delay circuit, comprising:
    a first input that receives an input signal when the delay circuit is in operation;
    a long L gate comprising a plurality of long L transistors;
    a first activation transistor coupled to a gate of each long L transistor of the plurality of long L transistors;
    a second activation transistor coupled to the gate of each long L transistor of the plurality of long L transistors;
    a switch directly coupled to a second input of the long L gate;
    a path directly coupled to a first output of the long L gate;
    a capacitor coupled to the path; and a second output that when in operation transmits an output signal as a delayed signal with respect to the input signal.

16. The delay circuit of claim 15, comprising:
a second long L gate comprising a second plurality of long L transistors, a third input, and a third output directly coupled to the path;
a third activation transistor coupled to a gate of each second long L transistor of the second plurality of long L transistors;
a fourth activation transistor coupled to the gate of each second long L transistor of the second plurality of long L transistors; and
a second switch directly coupled to the third input of the second long L gate.

17. The delay circuit of claim 16, comprising a second path is coupled between the second output of the delay circuit and a gate of the first activation transistor, wherein the second path is coupled between the second output of the delay circuit and a gate of the second activation transistor, wherein the second path is coupled between the second output of the delay circuit and a gate of the third activation transistor, wherein the second path is coupled between the second output of the delay circuit and a gate of the fourth activation transistor.

18. The delay circuit of claim 17, wherein the output signal activates the first activation transistor and the third activation transistor and deactivates the second activation transistor and the fourth activation transistor when the output signal has a first value.

19. A method, comprising:
receiving an input signal;
transmitting the input signal to a switch directly coupled to a long L gate to selectively activate the switch to transmit energy to at least one long L transistor of the long L gate;
transmitting at least a portion of the energy from the at least one long L transistor of the long L gate across a path to a capacitor to store the at least a portion of the energy in the capacitor;

discharging the least a portion of the energy from the capacitor along the path to a trip-point circuit that controls output of an output signal as a delayed signal with respect to the input signal;
transmitting the output signal to a first activation transistor coupled to a gate of the at least one long L transistor to activate the first activation transistor to provide a first voltage to the gate of the at least one long L transistor when the output signal has a first value; and
transmitting the output signal to a second activation transistor coupled to the gate of the at least one long L transistor to activate the second activation transistor to provide a second voltage to the gate of the at least one long L transistor when the output signal has a second value.

20. The method of claim 19, comprising:
transmitting the input signal to a second switch directly coupled to a second long L gate to selectively activate the second switch to transmit second energy to at least one second long L transistor of the second long L gate;
transmitting at least a portion of the second energy from the at least one second long L transistor of the second long L gate across the path to the capacitor to store the least a portion of the second energy in the capacitor;
discharging the at least a portion of the second energy along the path to the trip-point circuit;
transmitting the output signal to a third activation transistor coupled to a gate of the at least one second long L transistor to activate the third activation transistor to provide a third voltage to the gate of the at least one second long L transistor when the output signal has the first value; and
transmitting the output signal to a fourth activation transistor coupled to the gate of the at least one second long L transistor to activate the fourth activation transistor to provide a fourth voltage to the gate of the at least one second long L transistor when the output signal has the second value, wherein the second voltage and the fourth voltage are equal voltage values.

\* \* \* \* \*